United States Patent [19]

Scannell

[11] 4,223,266
[45] Sep. 16, 1980

[54] ADJUSTABLE SPRING REGULATOR FOR SETTING INDICATING INSTRUMENT POINTER

[75] Inventor: Edward F. Scannell, Saugus, Mass.

[73] Assignee: General Electric Company, New York, N.Y.

[21] Appl. No.: 948,174

[22] Filed: Oct. 2, 1978

[51] Int. Cl.$^2$ .............................................. G01R 1/00
[52] U.S. Cl. .......................... 324/154 R; 324/151 A; 324/154 PB
[58] Field of Search ................ 324/150, 151 R, 151 A, 324/154 R, 154 PB

[56] References Cited
U.S. PATENT DOCUMENTS

| | | | |
|---|---|---|---|
| 1,501,698 | 7/1924 | Beckert | 324/154 R |
| 1,661,214 | 3/1928 | Carpenter | 324/154 R |

Primary Examiner—Michael J. Tokar
Attorney, Agent, or Firm—Paul E. Rochford; Walter C. Bernkopf; Philip L. Schlamp

[57] ABSTRACT

Adjustment of an electrical measuring instrument of the D'Arsonval type is achieved by rotation of an annular leaf spring contact mounted to rotate between an annular plate and a flanged eyelet extending through the plate and leaf spring. A conducting coil spring attached to the spring contact transmits rotary orientation of the spring contact to an armature assembly disposed for rotation against the return force of the coil spring in an magnetic field.

10 Claims, 8 Drawing Figures

ADJUSTABLE SPRING REGULATOR FOR SETTING INDICATING INSTRUMENT POINTER

CROSS-REFERENCE TO RELATED APPLICATIONS

The subject application relates to the application of Edward F. Scannell and Donald E. Rogers entitled Means For Setting The Zero Point of a Meter, filed Oct. 2, 1978 and bearing Ser. No. 948,171. It also relates to the application of William J. Schultz and Carl F. Van Bennekom, entitled Pivot Insert Method and Article, filed Oct. 2, 1978, Ser. No. 948,191 and assigned to the same assignee as the subject application.

This application further relates to the application of Carl F. Van Bennekom, Donald E. Rogers and Edward F. Scannell, filed Oct. 2, 1978 Ser. No. 948,173 entitled Electrical Current Indicating Meter, and assigned to the same assignee as this application.

Further this application relates to the application of William J. Schultz and Carl F. Van Bennekom, filed Oct. 2, 1978, Ser. No. 948,172 entitled Magnetic System For Electrical Current Indicating Meter, and assigned to the same assignee as this application.

Still further this application relates to the application of Edward F. Scannell and Edward D. Orth, filed Oct. 2, 1978, Ser. No. 948,197 entitled Shielded Electrical Current Indicating Meter, and assigned to the same assignee as this application.

BACKGROUND OF THE INVENTION

It is well known that electrical and other indicating instruments have very broad use in the measuring art. Because of the large number of measurements which are made in regulating processes operated pneumatically, electrically or otherwise, there is need for large numbers of instruments. Because of the large number there is a premium on the smaller size instruments so that the instruments can be grouped to give readily available information to persons using the instruments.

Further, because of the very large number of such instruments which are used and the many purposes and applications in which they are employed, it is desirable that they be made at low cost and yet with high reliability and accuracy in performance.

Instruments of the D'Arsonval type include a moving armature or coil assembly which is mounted for rotation through the field of a permanent magnet assembly. When the armature assembly is energized by means of a current flowing therethrough, the resulting magnetic fields interact to produce a torque which rotates the armature assembly relative to the permanent magnet assembly. An instrument pointer is generally connected to the movable armature assembly to yield a readout with respect to a faceplate or scale mounted behind the pointer as the torque is a function of the current magnitude.

One of the requirements for accuracy in instruments such as those of the D'Arsonval type as provided pursuant to the present invention is that they have a standard and reproducible reading from one meter to another. In part this is dependent on having certain adjustment features feasible in the instruments. One such low-cost high-reliability and stable adjustment means is the subject matter of the present invention.

OBJECTS OF THE INVENTION

Accordingly, one object of the present invention is to provide a low cost highly reliable electrical instrument having a low profile and having incorporated within the instrument means for making adjustments to the setting of the instrument.

Another object is to provide a simple means by which an instrument may be adjusted with reference to its setting.

A further object is to provide a mechanism which is simple to build and assemble and which makes possible the reliable setting of the values which are obtained from operation of an instrument.

Still another object of the invention is to provide a method of compensating for the settings of an instrument so that zero setting may be achieved with great precision and reliability at low cost.

Other objects and advantages of the present invention will be in part apparent and in part pointed out in the description which follows.

BRIEF SUMMARY OF THE INVENTION

The present invention relates to an article useful in setting the indicator of an indicating instrument. The indicator may be a pointer acting responsive to some setting force such as pneumatic, electric, hydraulic or the like. The adjustment means includes a combination of a bottom plate having a center opening and a control window. It includes an annular spring disc mounted to the bottom plate by a flanged eyelet. The spring disc has perforations aligned with the control window to permit tool access to the disc perforations to rotate the disc. The flanged eyelet has a collar extending through concentric holes in the spring disc and plate and the collar is fastened at the end extending through the plate to secure the combination in operating relation. An arm extending from the spring disc adjusts an element mechanically linked to the indicator to thereby set the indicator.

More specifically, objects of the invention may be achieved by providing means for adjusting the position of an instrument pointer by adjustments to the tension on a spring incorporated as part of the control mechanism of the instrument. The position or orientation of the pointer is the means by which values indicated by the instrument are made evident. The mechanism incorporates a bottom annular plate having an assembly aperture at the center thereof and having a tool opening adjacent to the center assembly opening. An annular leaf spring member is generally circular in configuration and has a center opening slightly larger than the opening of the annular plate. The annular leaf spring is provided with a plate contour which brings portions of the leaf spring out of the plate of the leaf spring itself.

A side arm extends from an outer edge of the annular leaf spring and is bent away from the annular plate to receive one end of a torsion spring incorporated within the instrument mechanism. An assembly eyelet extends through the annular leaf spring and through the center opening of the annular plate to assemble the annular leaf spring in rotatable relation on the annular plate. The assembly eyelet element includes a downwardly extending collar and an outwardly extending flange and a spacer shoulder positioned between the collar and flange. When the eyelet is assembled to the annular spring and plate the spacer shoulder extends through the center opening in the annular leaf spring. When assembled the leaf spring rotates about the shoulder of the assembly eyelet. The annular leaf spring has a number of peripheral openings or perforations for rotary movement of the disc spring. The peripheral openings are accessed through the control window by an appropriate pointed tool extending through the window. The assembly of the eyelet, the annular spring and annular plate is accomplished by inserting the eyelet through the center opening of the annular spring and through the center opening of the plate and by then forming the downwardly extending collar of the assembly to stake the outer end of eyelet collar on the underside of the plate. One end of the lower spiral spring is attached at the side arm extending from the annular spring. The other end of the lower spiral spring is attached to an arm extending down from a bobbin on which is wound a coil for conducting the electricity to be tested. An upper spiral spring is attached at the upper part of the bobbin and the other end of the upper spiral spring is attached to an electrode where current may be fed to and through the spring and other mechanism to the plate to which the assembly eyelet is mounted. A magnetic field is created in the region where the bobbin moves by a permanent magnet mounted to the lower plate.

BRIEF DESCRIPTION OF THE DRAWINGS

The invention and the manner in which it can be carried into effect will be better understood by reference to the attached drawings in reading the detailed description of a preferred embodiment of the present invention which follows.

DESCRIPTION OF THE PREFERRED EMBODIMENT

Figure 1:
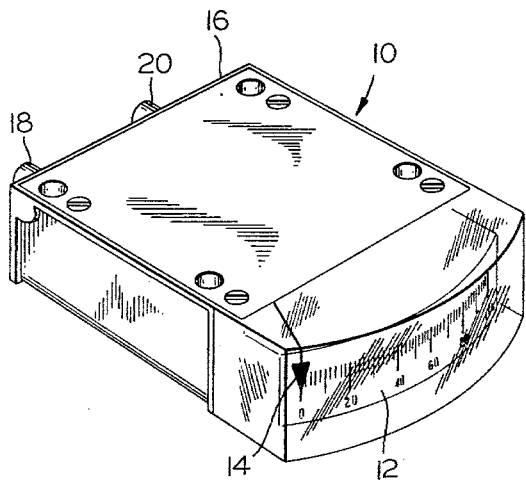
FIG. 1 is a perspective view of an instrument as provided pursuant to the present invention.

Referring first to FIG. 1, the instrument shown is one of a number of possible instruments which can be employed in accordance with the present invention. The particular instrument shown is an electrical measuring instrument having a front scale 12, a pointer 14 which shows the values indicated by the instrument on the scale and a generally rectangular housing 16 containing the sundry electrical elements and parts which make up the instrument. In the case of an electrical instrument the two electrical terminals 18 and 20 are the terminals to which wires carrying the current to be measured are connected.

Figure 2:
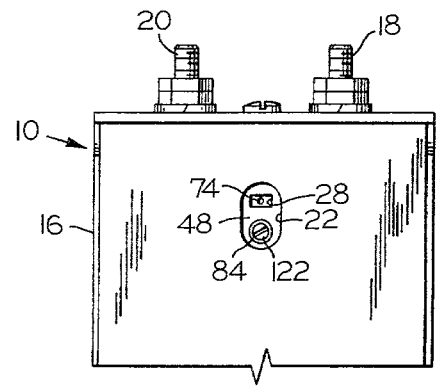
FIG. 2 is a partial bottom view of the instrument of FIG. 1.

In FIG. 2, an opening 22 in the back of casing 16 of instrument 10 makes visible a central hole 84 shown to include the screw member 122 and also to include the control window 28. Within the control window 28 there is illustrated one perforation 74 of a series of perforations in an annular leaf spring only a portion of which is visible through the control window 28.

Figure 3:
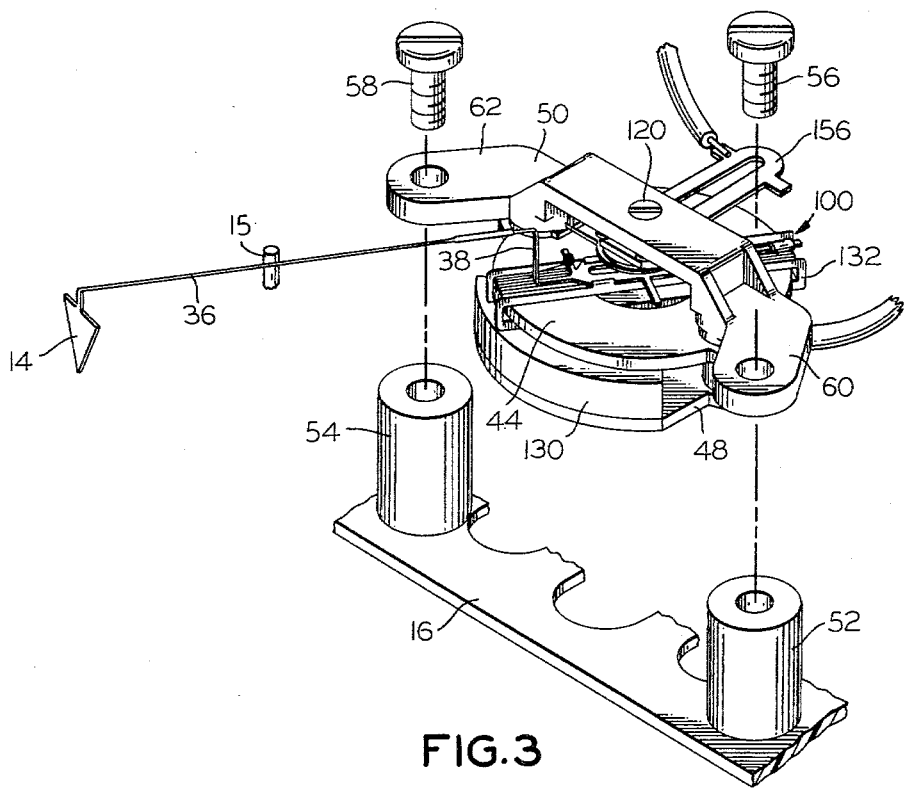
FIG. 3 is a partially exploded perspective view of the internal mechanism of the instrument of the present invention.

Referring next to FIG. 3, one form of mounting of portions of an electrical measuring instrument is shown in a partially exploded perspective view. The pointer 14 corresponds to the pointer 14 in FIG. 1. The pointer arm 36 extends back from the pointer 14 to the pointer arm support 38. This support 38 is formed integrally with a plate 140 and the plate is mounted on the bobbin 132. The bobbin pivots about an upper flux plate 44. Magnetic elements 128 and 130 are disposed above lower flux plate 48. The assembly is supported by the yoke 50 and is assembled to the posts 52 and 54 in the housing element 16. The screw members 56 and 58 hold the arms 60 and 62 of the yoke 50 in the respective positions in the posts 52 and 54. The adjustment mechanism which is the subject matter of this application is not illustrated directly in FIG. 3.

Figure 4:
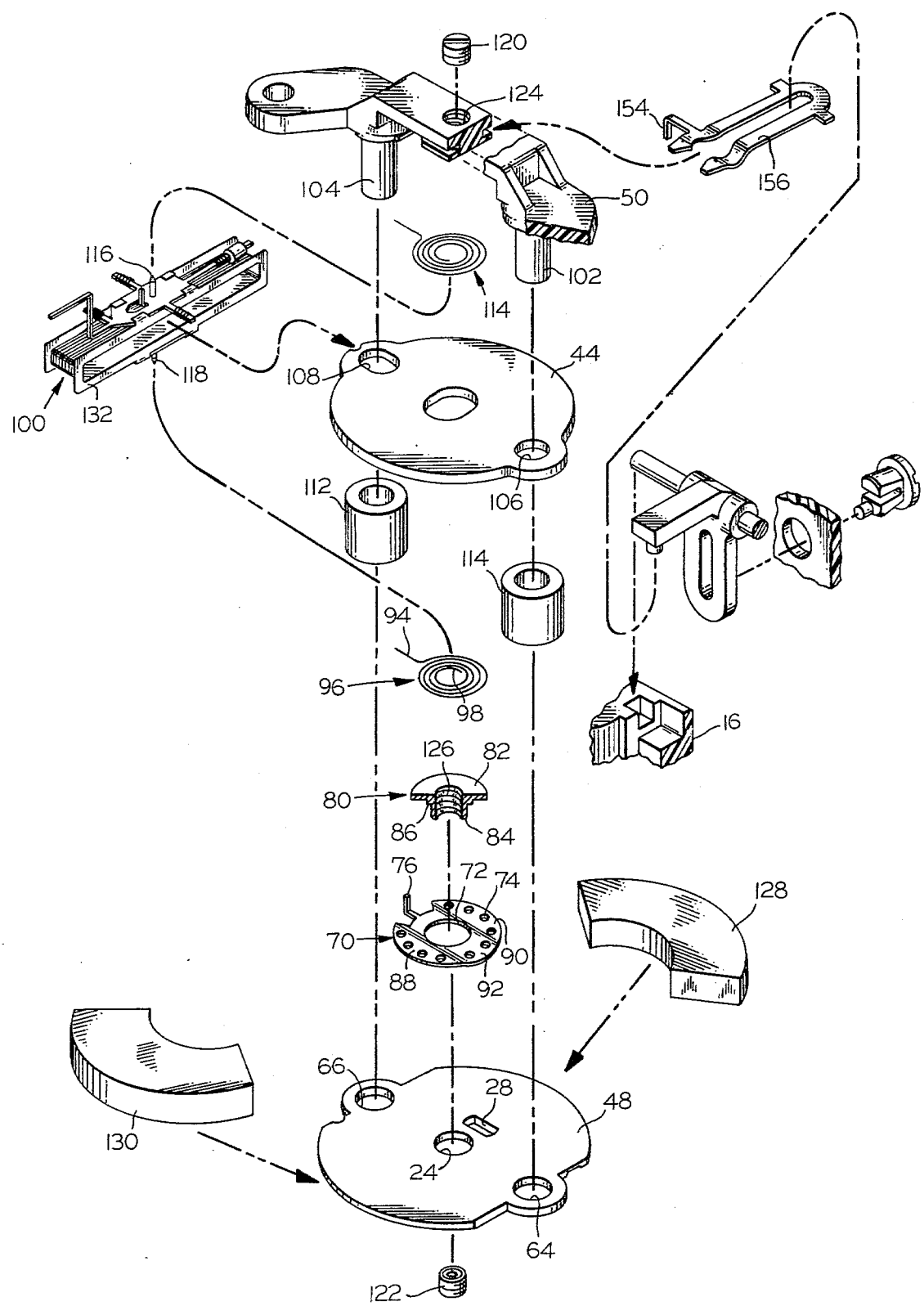
FIG. 4 is a more fully exploded view of the instrument mechanism of the present invention.

Turning next to FIG. 4, the mechanism illustrated in part in FIG. 3 is shown in exploded view in FIG. 4. The portion of principal interest in relation to this invention is shown in the lower portion of FIG. 4. Starting at the bottom there is a flux plate 48 having a center opening 24 and two side openings 64 and 66. A control window 28 provides access from beneath plate 48 to an annular leaf spring 70. The annular leaf spring 70 is made up to include a center opening 72 as well as a number of peripheral openings 74. A side arm 76 for coil spring attachment is formed integrally with the annular leaf spring 70 and extends from one edge thereof to be attached as appropriate to a coil spring of the instrument or to an equivalent torsion force inducement means.

A flanged assembly eyelet 80 is disposed above the annular leaf spring 70 in the exploded view of the elements as illustrated in FIG. 4. The flanged assembly eyelet 80 includes the outwardly extending flange 82 and the downwardly extending collar 84. There is also a spacer shoulder 86 which is slightly smaller in diameter than the center opening 72 of the annular leaf spring 70 and which is slightly less shallow than the full depth of the annular leaf spring 70 with the axial indentations made thereon. For example, in the annular leaf spring of FIG. 4 the two side portions 88 and 90 are raised relative to a central portion 92. Side arm 76 of annular leaf spring 70 is attached to side arm 94 of a lower coil spring 96. Such attachment may be by brazing, soldering, welding or the like. Coil spring 96 is attached at its center arm 98 to the under carriage of armature 100.

The armature 100 is described with greater particularity with reference to FIG. 5 below. But as is apparent from FIG. 4 the assembled armature including bobbin 132 itself is mounted over the upper flux plate 44 by sliding the plate into the opening in the bobbin. Once the bobbin is in place about the plate 44 the plate and yoke 50 can be assembled to the lower flux plate 48 by inserting the legs 102 and 104 of yoke 50 through the corresponding openings in the spacer bushings 110 and 112 to align the legs 102 and 104 with the openings 64 and 66 of flux plate 48.

The pivoting of the armature 100 including bobbin 132 is on the two oppositely extending pins 116 and 118 and these pins pivot within the jeweled screw elements 120 and 122. The jeweled screw element 120 is threaded into opening 124 in yoke 50 and the jeweled screw element 122 is threaded into the threaded openings 126 in assembly eyelet 80. Magnetic elements 128 and 130 provide a permanent magnetic field in the instrument against which the coil of the armature 100 can operate when current flows through the coil and creates a magnetic field in the armature.

Figures 5, 6:
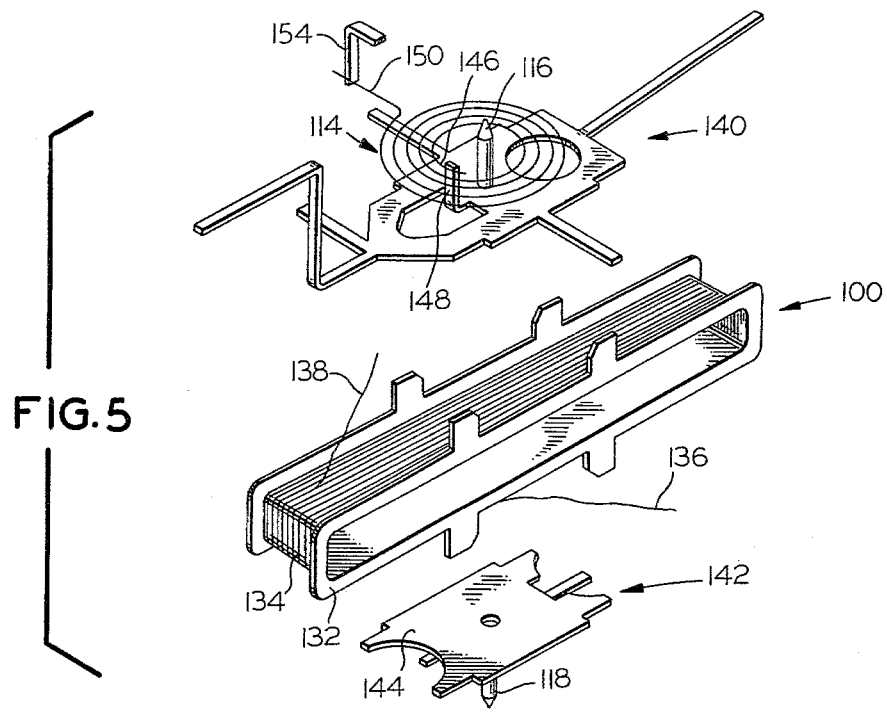
FIG. 5 is a perspective exploded view of an armature structure as may be employed in an electrical measuring instrument employing the adjustment mechanism provided pursuant to this invention.
FIG. 6 is a vertical sectional view of an armature as illustrated in FIG. 5 assembled and mounted in an instrument and showing one means by which adjustment is achieved.

Turning now to FIG. 5 the armature including bobbin 132 and the torsion coil 114 are shown with the components thereof exploded for clarity of presentation. The armature includes the bobbin 132 having the winding 134 wound thereon. The two ends of the winding 136 and 138 are illustrated extending from the bobbin and these lead lines are connected electrically to the upper plate 140 and the metal plate 142 below the insulating plate 144. The coil spring 114 is attached at its inner end 146 to the upstanding contact 148 of the upper plate 140. The outer end 150 of coil 114 is attached to the depending arm 154 of a pivot element 156. The movement of pivot element 156 causes a change in the torsional force exerted by spring 114 on the armature 100 and accordingly causes a displacement of the zero setting for the armature 100. A depending contact arm 156' depending from the lower conducting plate 142 of armature 100 is attached to the inner end 98 of lower coil spring 80. The outer end 94 of coil spring 80 is attached to the upstanding contact arm of annular leaf spring 70.

The relation of the parts will be made clear by comparison of the illustration of FIGS. 4 and 6 in considering the coil springs and their manner of attachment to the mechanism of the instrument. In FIG. 6 some rotation of the elements is made in order to add clarity to the relationships between the various parts. A window 28 is illustrated to the right of jeweled screw 122 in the lower flux plate 48. The window is positioned beneath the openings or perforations 74 in the annular spring 70 and this relationship is illustrated also in FIG. 2. A tool 166 having a boss 168 is illustrated in FIG. 6 entered through window 28 and positioned within a perforation in spring 70. The tool thus enters through window 28 and operates on the perforations 74 in the perimeter of the annular spring 70 to rotate the spring clockwise or counterclockwise.

A unique property of the adjustment mechanism of this invention is that the adjustment may be carried out to any degree which is found necessary in order to bring the two coil springs into balance and to make an appropriate adjustment of the zero point of the instrument. It is important to observe that the mechanism described in an external zero-setting adjuster. By zero-setting in this reference is meant the setting of the pointer when the winding of the armature of the instrument is de-energized. At this zero-setting the torsion exerted by the two coil springs essentially balance and offset each other. In setting the instrument the preferred procedure is to set the upper coil spring to a desired position. The bottom coil spring is then rotated clockwise or counterclockwise with the aid of the tool 166 as needed to set the pointer on a desired reference zero point.

The mechanism described above can be employed in setting the instrument for suppressed zero-type readings and this is accomplished in the described instrument by rotating the bottom spring regulator onto which the bottom control spring 96 is attached. When the instrument is used for the suppressed zero-type ratings the pointer is held against a pointer stop such as element 15 of FIG. 3. In this mode of use the armature does not move until a counter torque is developed by the energization of the winding 134 to a degree that the electrical torque produced by the input current counter-balances the mechanically suppressed movement. To obtain the desired accuracy for this mode of operation the suppression adjustment through the mechanism of the present invention must be a smooth, fine, vernier type control or adjustment. It is precisely this quality of adjustment which is provided by the mechanism described and claimed in this invention.

In some prior art devices it has been necessary to have four control springs for each torque requirement. By contrast the instrument described herein requires only one spring angle for the top and the bottom control spring due to the fact that the lower contact tab 76 can be turned through any number of degrees (including more than 360 degrees) and can be turned to any point on the radius circumscribed by the bottom regulator.

It is apparent that while the annular spring 70 is shown to have perforations 74 that equivalent mechanism as for example gear teeth could be employed and equivalent results would follow.

The mechanism of the present invention is useful not only to the ultimate user of the instrument in making adjustments from the exterior of the instrument to the setting which is provided within the instrument, but the mechanism is also useful to the maker at the end of the manufacturing process in making setting of the instrument which will permit a proper setting to be provided for the instrument prior to the time that it is shipped and sold to the ultimate user. This latter setting can include, as indicated above, the suppressed zero-type ratings or settings as well as the non-suppressed type settings.

Figure 7:
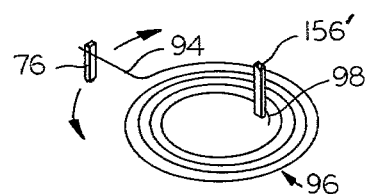
FIG. 7 is a perspective view of the lower torsion coil spring adapted to hold the bobbin and pointer in proper orientation.
Figure 8:
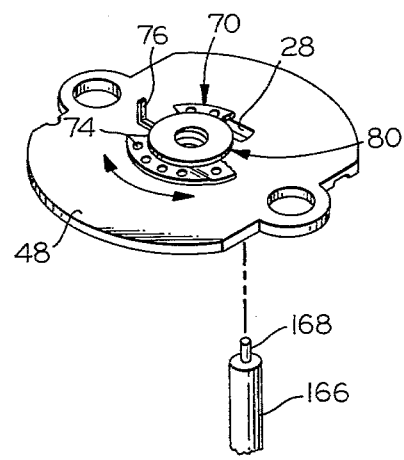
FIG. 8 is a perspective view of the assembled eyelet, annular spring and annular flux plate and illustrating an instrument poised below the plate for entry into the adjustment window for adjustment of torsion on the bobbin.

The assembled annular spring together with the bottom flux plate 48 and the assembly eyelet 80 is shown in FIG. 8 in part broken away to permit the window 28 to be seen. It is apparent from this illustration that the tool such as 166 having a boss 168 adapted to enter into the openings 74 of annular spring 70 can be readily adjusted through any desired number of degrees to any desired angle. The result of such indexing of annular spring 70 is the movement of the upstanding contact arm 76. Referring to FIG. 7 such movement of upstanding contact arm 76 has the effect of moving the outer arm 94 of spring 80 and changing the torsional force which is applied through the spring onto the depending contact arm 156' which arm depends from the conducting strip 142 illustrated in FIG. 6. The necessary and intended result is to adjust the torsional force applied to armature 100 and accordingly to adjust the zero position, including the suppressed zero adjustment of pointer arm 36 and pointer 14.

I claim:

1. An instrument indicator adjustment mechanism comprising:
   indicator means positioned by at least one torsion spring,
   an annular leaf spring mounted between a supporting plate and an assembly eyelet for said annular spring,
   means for attaching one of said at least one torsion spring to said annular spring,
   said one torsion spring being attached at one end to said attaching means of said annular spring and at the other end to a support for said instrument indicator means, and said annular spring having peripheral holes, said holes being aligned with an access window in the support plate for providing means for adjustment through the window of the angular deposition of said annular spring about its center.

2. The adjustment mechanism of claim 1 in which the annular leaf spring is dished to increase contact with the surfaces of confronting elements.

3. The adjustment mechanism of claim 1 wherein the instrument is of the D'Arsonval type.

4. The adjustment mechanism of claim 1 wherein the indicator means is mounted to an armature of a D'Arsonval type instrument.

5. The adjustment mechanism of claim 1 wherein the annular leaf spring is free to move through angles greater than 360°.

6. A mechanism for setting the spring return torsion of an electric measuring instrument of the D'Arsonval type within a casing comprising:

a flux plate of said instrument disposed at an exposed surface of said casing at an opening in said casing, said flux plate having a center opening and a control window opening proximate the center opening and accessible through the casing opening, an annular spring torsion regulator, said annular spring having leaf spring characteristics and having a center opening, peripheral perforations and a side arm, a flanged assembly eyelet having a depending collar, said collar extending through the center opening of the annular spring regulator and of the flux plate and said collar being formed to hold the eyelet, annular spring regulator, and flux plate in assembled relation, said annular spring regulator having portions formed out of its initial plane to bear against the flux plate and the flange of said eyelet, the peripheral perforations of said annular spring regulator being aligned with the control window of said flux plate to permit entry of a tool for rotation of said regulator, a coil spring attached at one end to said regulator, and attached at the other end to the armature of said D'Arsonval type instrument bearing an instrument indicator pointer whereby rotation of said annular spring regulator increases or decreases the otrsion of said coil spring and the adjustment of said instrument indicator.

7. The mechanism of claim 5 wherein the annular spring regulator is mounted to move through rotational angles of more than 360°.

8. The mechanism of claim 5 wherein the coil spring is attached at its outer end to said regulator and at its inner end to said armature.

9. The mechanism of claim 5 wherein the torsion on the indicator is at a suppressed-zero level.

10. The mechanism of claim 5 wherein a shoulder on the eyelet bears against the flux plate and provides a separation between eyelet flange and flux plate in which the spring regulator can be moved from one set position to another.

* * * * *